United States Patent

[11] 3,588,543

[72] Inventor Harold L. Schwartz
Philadelphia, Pa.

[21] Appl. No. 4,461
[22] Filed Jan. 20, 1970
[45] Patented June 28, 1971
[73] Assignee Burroughs Corporation
Detroit, Mich.
Continuation of application Ser. No. 687,297, Dec. 1, 1967, now abandoned.

[54] SEMICONDUCTOR PULSE GENERATOR INCLUDING LOGIC GATES, RAMP GENERATOR AND THRESHOLD DETECTOR FOR PROVIDING CONTROLLED-WIDTH RECTANGULAR PULSES
2 Claims, 3 Drawing Figs.

[52] U.S. Cl. .......... 307/265, 307/228, 307/315, 328/58
[51] Int. Cl. .......... H03k 1/18
[50] Field of Search .......... 307/228, 260—269; 328/58, 59, 60—62, 181—185

[56] References Cited

UNITED STATES PATENTS

| | | | |
|---|---|---|---|
| 2,892,083 | 6/1959 | Norris | 328/58 |
| 3,192,408 | 6/1965 | Cho | 307/265X |
| 3,210,558 | 10/1965 | Owen | 307/228 |
| 3,277,319 | 10/1966 | Stevens, Jr. | 307/265 |
| 3,346,743 | 10/1967 | Strenglein | 328/58X |
| 3,465,174 | 9/1969 | Soltz | 307/265X |
| 3,484,624 | 12/1969 | Rasiel et al. | 307/265 |

*Primary Examiner*—Stanley D. Miller, Jr.
*Attorney*—Ralzemond B. Parker

ABSTRACT: A pulse generator which comprises a system of interconnected semiconductor logic units which includes a ramp generator and threshold detector combination. An input signal pulse activates the ramp generator. The ramp generator includes a capacitor and transistor which maintain the charging current for the capacitor at a constant value. The output signal from the ramp generator is transmitted to the threshold detector which is activated when the output signal reaches a predetermined value, the output pulse duration being determined by that value.

INVENTOR.
HAROLD L. SCHWARTZ
BY Irving Kirchner
AGENT

SEMICONDUCTOR PULSE GENERATOR INCLUDING LOGIC GATES, RAMP GENERATOR AND THRESHOLD DETECTOR FOR PROVIDING CONTROLLED-WIDTH RECTANGULAR PULSES

CROSS REFERENCE TO RELATED APPLICATION

This is a continuation of application, Ser. No. 687,297, filed Dec. 1, 1967, and now abandoned.

BACKGROUND OF THE INVENTION

In the past, pulse-forming circuits have generally relied upon the nonlinear charging rates of reactive networks as a means for determining the duration of an output pulse. Such circuits, however, have proven to be inadequate particularly in instances where narrow pulse width signals are required. Even minor variations in the values of the reactive components or the nonlinear charging currents therethrough, give rise to significant changes in the output pulse parameters. In addition, the pulse parameters are nonlinear with respect to the applied control voltages.

The use of the nonlinear charging rates of the reactive networks in the past increased the noise sensitivity of the overall system and required a large value for the charging capacitor resulting in a long recovery time for the circuit.

SUMMARY OF THE INVENTION

The present invention relates to a semiconductor pulse-forming circuit and in particular to a circuit which includes a reactive element that charges at a linear rate and which determines the duration of an output pulse. This linearly charging voltage, or voltage ramp, is generally produced by maintaining the charging current through a capacitor at a constant value. The current is maintained constant in the present invention by using a pair of transistors connected together in a Darlington amplifier circuit configuration. When the ramp voltage output signal exceeds a preset reference voltage level in a threshold detector connected thereto, the threshold detector changes state from a high voltage to a low voltage. The occurrence of the change in state determines the pulse output duration.

It is an object of the present invention to provide a novel pulse-forming circuit whose noise sensitivity is reduced by maintaining the current through a reactive element at a constant value.

It is a further object of the present invention to provide a novel pulse-forming circuit which requires a smaller capacitive value for the charging capacitor than those used in the past.

It is still a further object of the present invention to provide a novel pulse-forming circuit which has a faster recovery time than devices used in the past.

Other objects and features of the present invention will become apparent from the following detailed description when taken in conjunction with the drawings in which:

FIG. 1 is a block diagram representation of the preferred embodiment of the present invention, FIG. 2 illustrates waveforms observed at various points of the pulse-forming circuit, and FIG. 3 is a schematic diagram of the ramp generator and the threshold detector portions of the present invention.

DESCRIPTION OF THE PREFERRED EMBODIMENT

Figure 1:
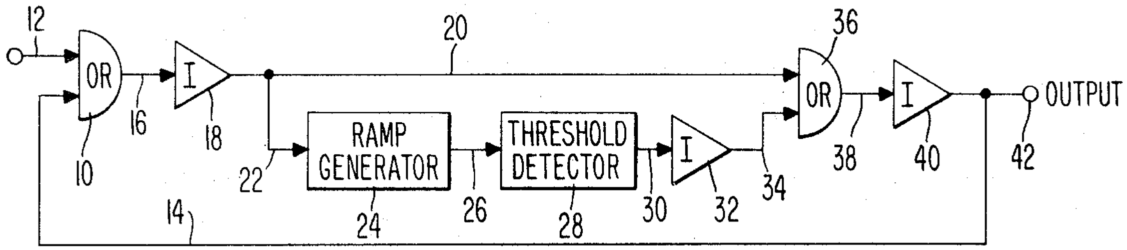

Referring now to FIG. 1, the pulse-forming circuit of the present invention comprises an OR gate 10 having a pair of gate input leads 12 and 14. The gate output lead 16 is coupled to inverter 18, the latter having its output connected via leads 20 and 22 to one input of OR gate 36 and to the ramp generator 24 respectively. The output lead 26 of the ramp generator 24 is connected to threshold detector 28, the output 30 thereof being connected to an inverter 32. The inverter 32 output lead 34 is connected to the second input of OR gate 36, the output thereof connected via lead 38 to inverter 40. The output lead of inverter 40 is coupled to an output terminal 42 and as a feedback to the input lead 14 of OR gate 10.

Figure 2:
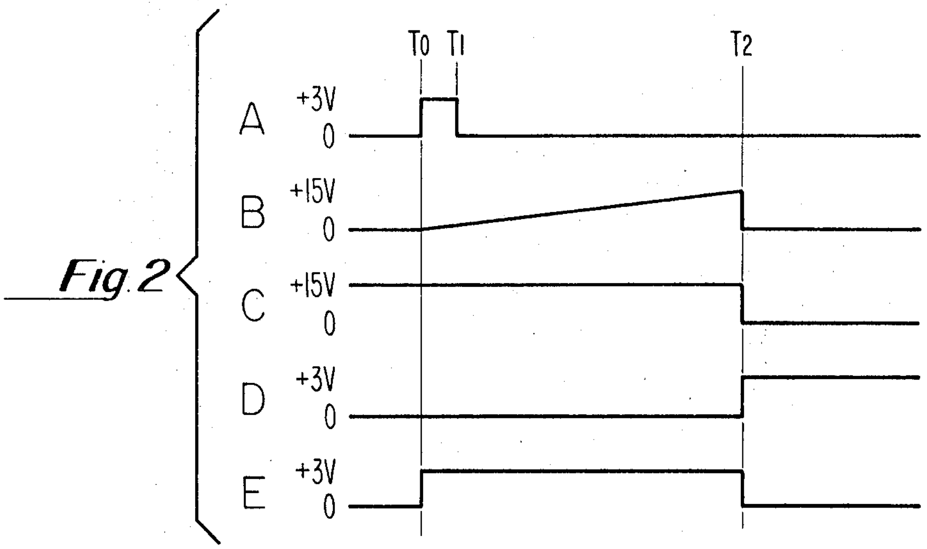

The operation of the pulse-forming circuit illustrated in FIG. 1 will be described with reference to the representative waveforms shown in FIG. 2. FIG. 2A, for example, shows a positive going pulse signal which is initiated at the time $T_0$ and which terminates at the time $T_1$. Time $T_0$ to $T_1$ is a minimum of 500 nanoseconds. This signal is coupled to the gate input lead 12 and appears on gate output lead 16 which is coupled to inverter 18. The inverter signal appearing on lead 22 activates the ramp generator 24, output signal thereof illustrated by the waveform of FIG. 2B. The waveform shows a positive going signal initiated at the time $T_0$ and which increases linearly from approximately zero voltage towards a positive voltage level of approximately 15 volts. This positive voltage ramp is applied to the input of threshold detector 28 which changes from its initial "1" or high state to the "0" or low state when the voltage ramp exceeds the reference voltage level $V_0$ at the time $T_2$. The resultant step output on lead 20 is illustrated in FIG. 2C. The threshold detector output signal is thereafter applied to the inverter gate input lead 30. The output from inverter 32 is fed to OR gate 36 via lead 34. The output from OR gate 10 is also applied to gate 36 via inverter 18 and lead 20. The output of OR gate 36 is connected to inverter gate 40 via lead 38. The output of inverter 40 is connected to OR gate 10 via feedback lead 14 and is also connected to output terminal 42.

Since the threshold detector output returns to 0 at the time $T_2$, the output of inverter gate 32 becomes 1. Thus the input to OR gate 36 between times $T_1$ and $T_2$ is that appearing on lead 34 and is shown on FIG. 2D. The inverter 40 inverts the inputs thereto. The output at 42 remains at 1 when the input pulse returns to 0 at time $T_1$. The resultant output of the circuit of the present invention is shown in FIG. 2E, the output pulse having a time duration between $T_0$ and $T_2$ and a time delay determined by the inherent lag between the time the voltage impulse is applied to input 12 of OR gate 10 and the time this input is received at the output terminal 42.

Figure 3:
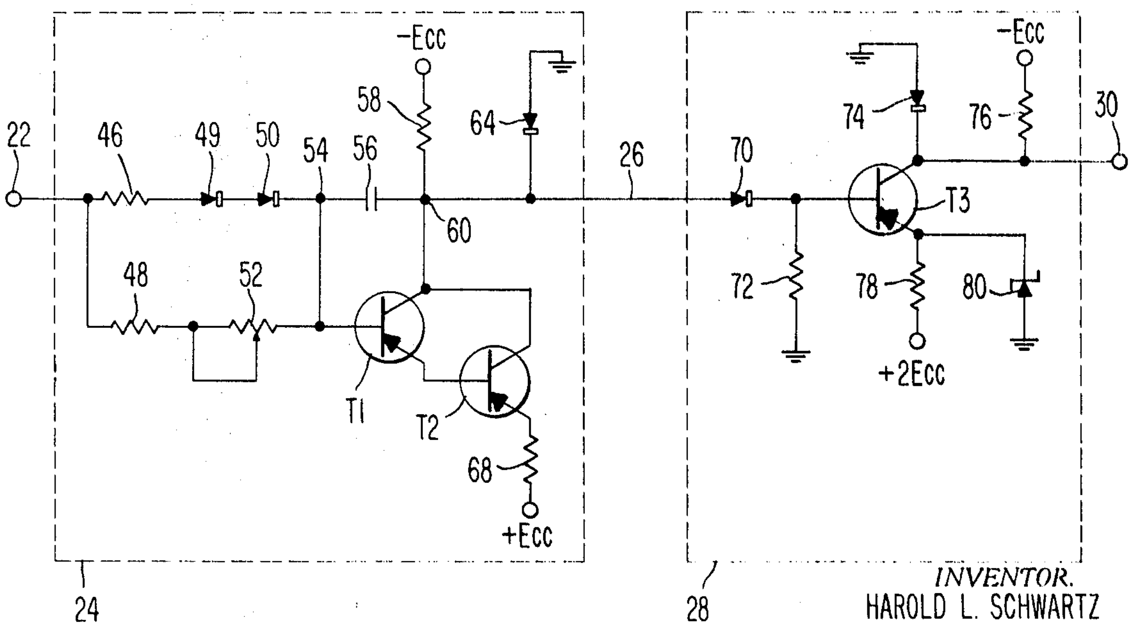

Preferred embodiments of the ramp generator 24 and the threshold detector 28 of FIG. 1 are shown in detail in FIG. 3. The ramp function generator 24 includes an input terminal 22 feeding a parallel circuit, one arm of which includes resistor 46 in series with diodes 49 and 50. Each diode is poled with its anode toward input terminal or lead 22. The other arm includes resistor 48 and trimming resistor 52. Resistor 52 is connected to the cathode of diode 50 at junction 54. Junction 54 is connected to the base electrode of PNP transistor T1 and also to one terminal of capacitor 56, the other terminal of capacitor 56 being connected to junction 60 and therefrom to the ramp generator output lead 26. The emitter electrode of transistor T1 is connected to the base electrode of PNP transistor T2 while the collectors of the transistors are connected together forming a Darlington amplifier circuit pair. The current gain of the circuit pair is the product of the individual current gains of T1 and T2 and low distortion results from the use thereof. The collectors of transistors T1 and T2 are from junction 60 also connected to voltage source −Ecc via resistor 58. Diode 64, the anode of which is connected to ground, has its cathode connected to the common collector of transistors T1, T2 via junction 60. The emitter electrode of transistor T2 is connected to a source of voltage +Ecc via resistor 68.

The output of the ramp generator is connected to the anode of diode 70 of to threshold detector 28 via lead 26. The cathode of diode 70 is connected to one terminal of resistor 72 and to the base electrode of PNP transistor T3. The opposite terminal of resistor 72 is grounded. The collector of T3 is connected to the cathode of diode 74 and to one end of resistor 76. The anode of diode 74 is connected to ground and the other end of resistor 76 is connected to a source of potential −Ecc. The collector electrode of transistor T3 is also connected to output terminal lead 30 which is the input to inverter 32 as shown in FIG. 1. The emitter electrode of collector T3 is connected to one end of a resistor 78 and to the cathode of Zener diode 80. The other end of resistor 78 is connected to a source of potential $+2E_{cc}$ and the anode of Zener diode 80 is connected to ground.

In operation, before the input pulse shown in FIG 2A is applied to OR gate 10, the input voltage appearing on line 22 will be a "1" or high. In this initial condition diodes 49 and 50 are forward biased and the amount of current flowing through the parallel circuit arm containing them and the arm containing resistors 48 and 52 will be determined by values of the resistances in each arm. Currents flowing through these parallel branches bias transistor T1 to cutoff. The voltage on the capacitor 56 is negative relative to terminal 60, forward biasing diode 64 and maintaining a zero voltage at junction 60. Diode 70 is reverse biased at this time and no signal is transmitted from ramp generator 24 to the threshold detector 28. The detector is initially biased in the saturated conducting state and the output appearing at terminal 30 is approximately 15 volts. The output appearing initially at terminal 42 is approximately zero.

Upon application of the positive pulse to terminal 12, such as the signal which is initiated at the time $T_o$ in FIG. 2A, a negative going pulse appears on terminal 22 due to the inverter 18. This negative going pulse reverse biases diodes 49 and 50 therefore effectively disconnecting this parallel arm from the circuit. The negative going pulse is transmitted directly to the base of transistor T1 via resistors 48 and 52 and the voltage on capacitor 56 does not initially change since the charge on a capacitor cannot change instantaneously. Transistors T1 and T2 turn on as a Darlington pair and capacitor 56 starts to charge to a positive voltage determined by the voltage pulse appearing on terminal 22 and by the value of resistors 46, 48 and 52.

The instantaneous voltage across the capacitor 56 is known to be dependent upon the integral of the instantaneous current therethrough. In most circuit configurations, the charging current for a capacitor varies exponentially with time. An exponential voltage rise is therefore developed across a capacitor. In the present invention, however, the charging current for the capacitor 56 is maintained constant by the action of transistors T1 and T2 so that the voltage across the capacitor increases uniformly with time to produce a voltage ramp signal shown in FIG. 2B.

At the time $T_2$ the diode 70 becomes forward biased and drives transistor T3 from its initially saturated conducting state into the off (or nonconducting) state and the collector voltage appearing at output terminal 30 is driven to zero as shown in FIG. 2C. This voltage is fed to inverter 32 (shown in FIG. 1) and thereafter to OR gate 36 and inverter 40. The output appearing at terminal 42 is shown at FIG. 2E, the output being a pulse of duration $T_o$ to $T_2$ and being independent of the duration of the input pulse shown in FIG. 2A.

Representative values of circuit components schematically illustrated in FIG. 3 are listed herebelow.

Transistors T1, T2 and T3 are type 2N3251
Diodes 49 and 50 are type 1N4380
Diodes 64, 70 and 74 are type 1N4381
Zener Diode 80 is a type 1N964B Resistor Values are as follows:
$R_{46}$=22 ohms
$R_{48}$=430 kilohm
$R_{52}$=A250 kilohm potentiometer
$R_{58}$=7.5 kilohm
$R_{68}$=22 ohms
$R_{72}$=22 kilohm
$R_{76}$=7.5 kilohm
$R_{78}$=1 kilohm, one-half watt
Capacitor 56 is 47 $\mu f$.
Ecc=15 volts.

The circuit element values recited hereinabove have been calculated to provide an output pulse of 25 to 30 seconds duration as determined by the setting of $R_{52}$.

It is to be understood that the foregoing explanation is by way of illustration only. As will be evident to those skilled in the art the invention may be adapted to manufacture pulse-forming circuits by considerably varying the actual component values from those indicated above. Further one skilled in the art could adapt the schematic shown in FIG. 3 to accommodate either NPN or PNP transistors by merely choosing the appropriate biasing potentials. It will therefore be understood by those skilled in the art that various changes in form and details may be made therein without departing from the spirit and scope of the invention which is limited only by the appended claims.

I claim:

1. A pulse-forming circuit for generating a controlled-width output pulse in response to an input pulse comprising:
input means responsive to the occurrence of said input pulse for initiating the generation of a start signal, said input means including a first logical gate and a first inverter circuit,
means responsive to the presence of said start signal for generating a linear voltage ramp,
threshold means responsive to the attainment of a predetermined voltage level by said voltage ramp for terminating the generation of said voltage ramp and for generating a pulse indicative of the termination of said voltage ramp, said threshold means including a threshold detector and a second inverter circuit,
logical output means responsive to the presence of said start signal for initiating the generation of said output pulse and responsive to the presence of said pulse indicative of the termination of said voltage ramp for terminating the generation of said output pulse, said output means including a second logical gate and a third inverter circuit, and
means for feeding back said output pulse to said input means and maintaining the generation of said start signal until the termination of said output pulse.

2. The circuit of claim 1 wherein said means for generating a linear ramp includes a capacitor, and means for supplying a constant charging current to said capacitor, said means including a pair of transistors connected in a Darlington amplifier configuration.